United States Patent [19]

Smither

[11] Patent Number: 4,855,745
[45] Date of Patent: Aug. 8, 1989

[54] HIGH RESOLUTION ANALOG-TO-DIGITAL CONVERTER

[76] Inventor: Miles A. Smither, 6955 Santa Fe Dr., Houston, Tex. 77061

[21] Appl. No.: 108,727

[22] Filed: Oct. 14, 1987

[51] Int. Cl.4 .............................................. H03M 1/12
[52] U.S. Cl. .................................. 341/156; 341/118; 341/131
[58] Field of Search ................. 340/347 AD, 347 CC, 340/347 M; 341/118, 131, 136, 156, 158

[56] References Cited

U.S. PATENT DOCUMENTS

| | | | |
|---|---|---|---|
| 4,509,037 | 4/1985 | Harris | 340/347 |
| 4,544,917 | 10/1985 | Lenhoff, Jr. | 340/347 AD |
| 4,679,028 | 7/1987 | Wilson et al. | 340/347 AD |
| 4,686,511 | 8/1987 | Koen | 340/347 AD |

OTHER PUBLICATIONS

Van de Plassche, et al., A Five-Digit Analog-Digital Converter, IEEE Journal of Solid-State Circuits, vol. SC-12 No. 6, Dec. 1977, pp. 656-662.
Landsburg, A Charge-Balancing Monolithic A/D Converter, IEEE Journal of Solid-State Circuits, vol., SC-12 No. 6, Dec. 1977, pp. 662-673.
Van de Plassche, A Sigma-Delta Modulator as an A/D Converter, IEEE Transactions of Circuits and Systems, vol. CAS-25 No. 7, Jul. 1978, pp. 510-514.
Gordon, Linear Electronic Analog-Digital Conversion Architectures, Their Origins, Parameters, Limitations, and Applications, IEEE Transactions on Circuits and Systems, vol. CAS-25 No. 7 Jul. 1978, pp. 391-418.
Carley, An Oversampling Analog-to-Digital Converter Topology for High-Resolution Signal Acquisition Systems, IEEE Transactions on Circuits and Systems, vol. CAS-34 No. 1, Jan. 1987, pp. 83-90.

Primary Examiner—William M. Shoop, Jr.
Assistant Examiner—Marc S. Hoff
Attorney, Agent, or Firm—Arnold, White & Durkee

[57] ABSTRACT

An apparatus to convert an input analog signal into a high resolution digital signal in a short conversion time. The device utilizes a high resolution feedback circuit to reduce the high clock generally necessary for high resolution analog-to-digital conversion. Such a device utilizes a low resolution analog-to-digital circuit, which is the only component that must operate at a high clock rate. The device amplifies the difference between the input signal and the feedback signal to obtain a first high resolution digital signal. The device further improves the resolution by combining a dither signal with the amplified difference between the feedback signal and the input digital signal to update the first high resolution digital signal. This updated digital signal is successively added in an accumulator to obtain a higher resolution digital signal.

18 Claims, 3 Drawing Sheets

HIGH RESOLUTION ANALOG-TO-DIGITAL CONVERTER

BACKGROUND OF THE INVENTION

Digital signals, as opposed to analog signals, are readily transmitted and processed without substantially degrading the dynamic range, resolution and phase or linearity of these signals. For this reason, a wide range of commercial, industrial, scientific and military electronic systems convert analog signals to digital signals before transmitting or processing these signals. The rapid growth in the field of digital signal processing has sharply increased the need for high resolution analog-to-digital converters.

There are a number of existing classes of systems for analog-to-digital conversion or encoding. One such system is that of charge balance analog-to-digital converters. In a charge balance analog-to-digital converter (ADC), the input signal is balanced against a time average of a discretized feedback signal. During each clock cycle the ADC determines one bit of a $2^{}N$ bit conversion, where N, an integer, is the resolution of the ADC. A bipolar version of a charge balance ADC will require $2^{}(N-1)$ clock cycles to obtain each N-bit output. The standard bipolar charge balance ADC operates with a one bit digital-to-analog converter (DAC) in its feedback path. The difference (residue) between the external (input) analog signal and the DAC output is integrated and the sign of this integrated difference or residue is determined each clock cycle. If the integrated difference is positive, then the output of the feedback DAC is switched so as to drive the integrated difference negative. On the other hand, if the integrated difference is negative, then the output of the feedback DAC is switched so as to drive the integrated difference positive. A one bit accumulator (an up/down counter) is incremented in a direction which reflects the DAC output and the cycle is repeated. At the end of $2^{**}(N-1)$ clock cycles, an N-bit word is accumulated in the up/down counter. It should be noted that it is the integrator which provides the time average that is necessary for such a charge balance ADC to function.

It has been suggested that the above described approach can be extended to high resolution analog-to-digital converter (HRADC) designs. This approach, however, will increase exponentially the required clock rate. For N-bit resolution, the required clock rate will be:

$$FCLK = \frac{2^{**}(N-1)}{TC}$$

where FCLK is the required clock rate or frequency expressed in Hz, N is the resolution of the ADC and TC is the conversion time in seconds of the ADC, and where the symbol ** represents the exponentiation. The conversion time TC is the time in which the ADC system converts one sample of the analog input signal to a corresponding digital signal of a defined resolution. As an example, a 23 bit resolution, 1 millisecond (mSec) conversion time charge balance ADC will require a clock rate of 4.194 GHz. Such a high clock rate is very impractical.

The present invention addresses this shortcoming in part by increasing the resolution of the feedback path. By doing this the required clock rate for a given resolution is correspondingly decreased. As an example, if an M-bit resolution feedback path is used, M being an integer, the clock rate required to obtain an N-bit result will be:

$$FCLK = \frac{2^{}(N-1)}{TC \cdot 2^{}(M-1)} = \frac{2^{**}(N-M)}{TC}$$

Using the earlier example of a 23 bit resolution ADC system, a one mSec conversion time ADC with a 16-bit resolution feedback path, a clock rate of 128 KHz is required. This is certainly a more practical clock rate for use with a high resolution ADC. It will be noted that many different combinations of the feedback path resolution and the output resolution can be implemented within the spirit of this concept.

One serious problem still remains with designing an ADC based on the discussion above. The above example of a 23-bit resolution ADC using a 16-bit DAC will require a conversion time to 16-bits of resolution of 1/128 KHz or 7.8 $\mu$Sec, which is quite fast.

The present invention eliminates this problem by providing an improvement on the concept of using a high resolution feedback circuit, the improvement comprising updating a higher (M-bit) resolution accumulator by the use of a lower (K-bit) resolution ADC, where part of the updating is achieved by amplifying only the difference or the residue between the external analog signal and the feedback signal.

The system of the invention provides a further improvement in resolution by successively adding the updated output of the M-bit accumulator into an N-bit (N > M) accumulator. The system of the invention provides a further improvement in resolution by the use of a superimposed dither signal.

SUMMARY OF THE INVENTION

This invention is directed to a method and apparatus for converting an analog signal to a high resolution digital signal. In the system of the invention, a lower resolution ADC converts the external analog signal to a digital signal and stores it in the most significant bit locations of a first accumulator. The amplified difference between the external analog signal and the feedback from the first accumulator is amplified, digitized and stored in lower significant bit locations of the first accumulator to obtain a first high resolution digital signal. The contents of the first accumulator, when stable, are added into a second higher resolution accumulator.

A dither signal, which sweeps from a value below to a value above the external signal level, is added to the amplified difference (residue) to update the contents of the first accumulator each clock cycle. The updated or new contents are then successively added to the second accumulator. The successive addition of the updated contents of the first accumulator each clock cycle results in a digital signal which corresponds to the external analog signal and which has a higher resolution than the resolution of the output of the first accumulator. The sequence of converting the analog signal to a low resolution digital signal, then only amplifying the residue to obtain a high resolution digital signal in the first accumulator and then the use of a dither signal and successive additions of the updated signal to obtain a true higher resolution digital signal output enables the system of the invention to:

(a) use a low resolution ADC which is the only component that needs to operate at a fast conversion rate;
(b) use a low frequency clock (clockrate);
(c) provide a true high resolution digital signal that corresponds to an external analog input signal in a short conversion time.

The use of a dither signal also reduces the effect of any non linearity in the feedback DAC path and further improves the resolution.

Examples of the more important features of this invention have thus been summarized rather broadly in order that the detailed description thereof that follows may be better understood, and in order that the contribution to the art may be better appreciated. There are, of course, additional features of the invention that will be described hereinafter and which will also form the subject of the claims appended hereto.

These and other features and advantages of the present invention will become apparent with reference to the following detailed description of a preferred embodiment thereof in connection with the accompanying drawings wherein like reference numerals have been applied to like elements, in which:

DESCRIPTION OF THE PREFERRED EMBODIMENTS

In a preferred embodiment, this invention consists of a high resolution analog-to-digital converter (HRADC) which utilizes a multi-bit analog-to-digital converter, a multi-bit digital-to-analog converter in the feedback loop, an input amplifier means (input circuit) comprising a difference amplifier and a dither, two high resolution accumulators and a timing and control means.

Figure 1:
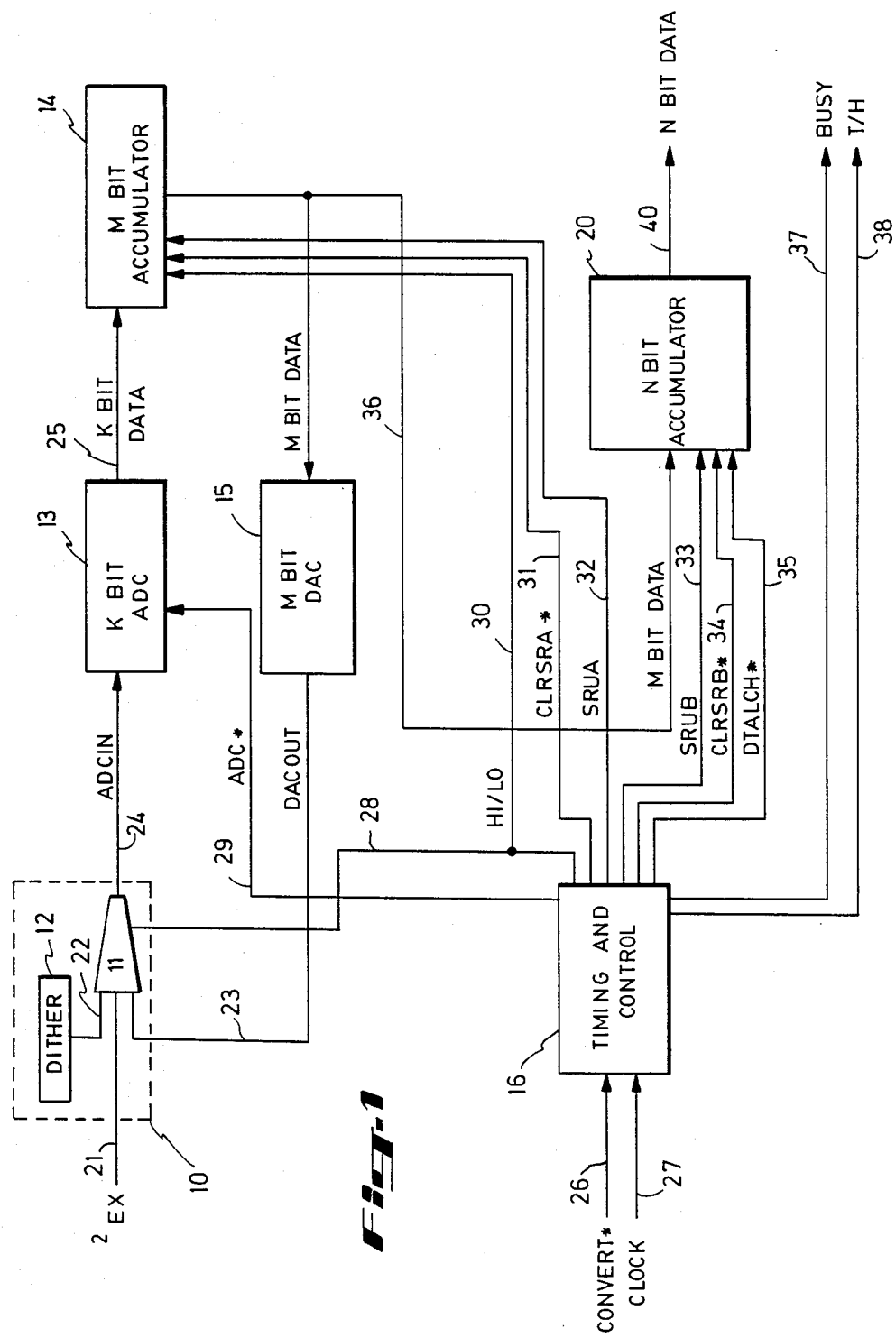
FIG. 1 illustrates a block diagram of a high resolution analog to digital converter embodying the invention.
Figure 2:
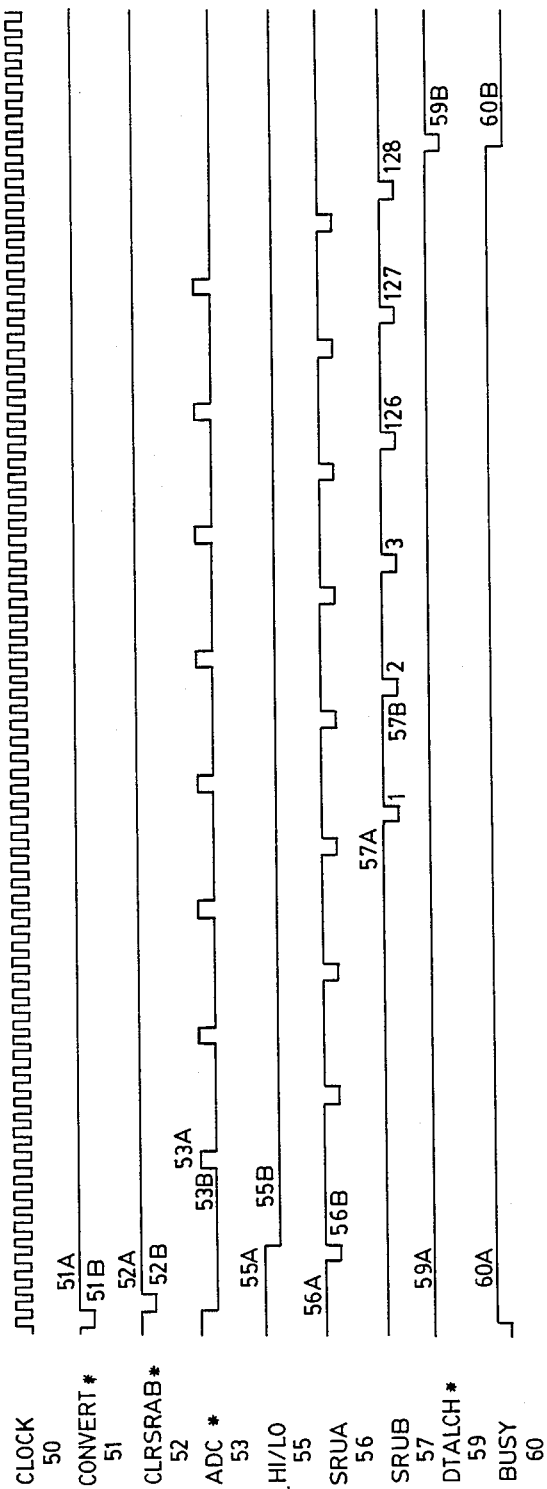
FIG. 2 illustrates a detailed timing and control diagram the timing and control circuit 16 of FIG. 1.
Figure 3:
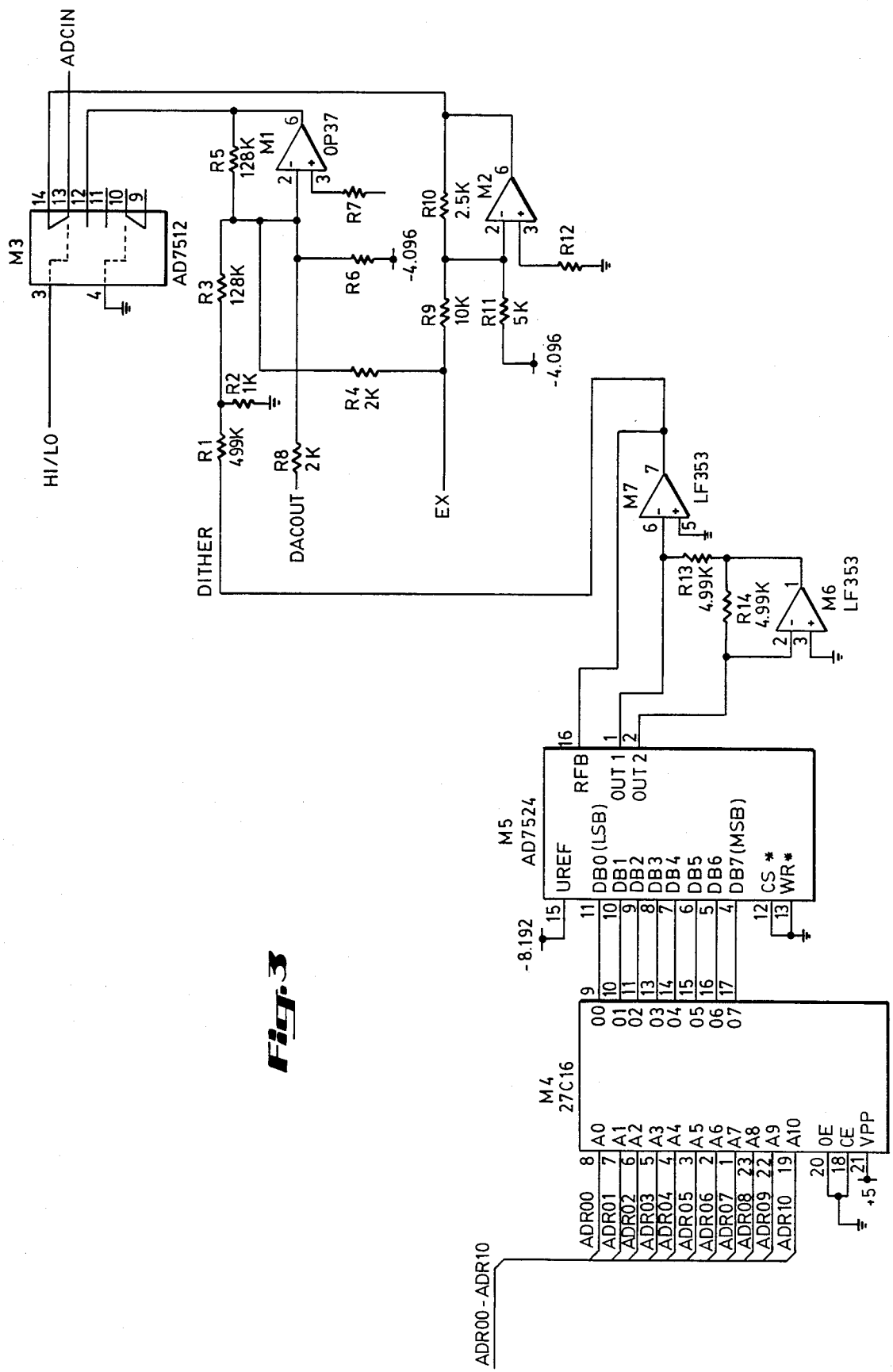
FIG. 3 is a detailed circuit diagram of the difference amplifier 11 of FIG. 1.

The invention in part comprises an improvement of a charge balance analog-to-digital converter. The block diagram for a specific embodiment is illustrated in FIG. 1. The corresponding timing diagram is illustrated in FIG. 2. A detailed circuit diagram for the difference amplifier is illustrated in FIG. 3.

As illustrated in FIG. 1, the block diagram of an embodiment of a HRADC consists of an input amplifier means 10, a K-bit analog-to-digital converter 13, an M-bit accumulator 14, an M-bit digital-to-analog converter (DAC) 15, a N-bit output accumulator 20 and a timing and control means 16. Generally, in the application of the illustrated analog-to-digital converter of FIG. 1, the letters K, M and N are integers and indicate the bit resolution of the corresponding element or means, where K is less than or equal to M ($K \leq M$) and M is less than N ($M < N$). M & N may also be referred to as the bit capacities of their respective accumulator.

As noted earlier, FIG. 2 illustrates a timing diagram that is used to convert the analog signal to a digital signal.

To understand the detailed operations of the high-resolution analog-to-digital converter system illustrated in FIG. 1, it is helpful to simultaneously discuss the timing diagram or the sequence of events as illustrated in FIG. 2.

The conversion process, i.e., the conversion of an external analog signal 2 is initiated by an external signal CONVERT* 51 as illustrated in FIG. 2. This signal is applied on CONVERT* line 26 of FIG. 1. After this signal is applied to the timing and control means 16, i.e., after the value 51b is applied, the timing and control circuit 16 generates a signal CLRSAB 52 on lines 31 and 34, which clears the registers or accumulators 14 and 20 respectively. Clearing of the registers 14 and 20 implies that all of the M-bits in the accumulator 14 and all of the N-bits in the accumulator 20 are now set at a digital state or a binary state of "0". Simultaneous to the generation of CLRSAB signal, another signal ADC* 53 is generated to activate the K-bit analog-to-digital converter (K-bit ADC) 13.

The analog input signal 2 to be converted is applied on the line 21. The low resolution conversion of the analog signal is performed with the signal HI/LO 55 in the HI-state 55a. The HI-state 55a enables the input amplifier 11 to simply pass the analog signal to be converted directly to the K-bit ADC 13, i.e., without offset or amplification. The K-bit ADC converts the signal into a K-bit digital signal. Thus, the result of this first conversion is a low resolution K-bit or digital encoding of the analog input signal.

When the control signal SRUA 56 is in HI-state 56a, the control line SRUA 32 in FIG. 1 goes high, which loads or places or accumulates the first K-bit sample at the output of the K-bit ADC into the K most significant bit locations of the M-bit accumulator 14, where M ($M \geq K$) is the total bit capacity of the M-bit accumulator. The output of the M-bit accumulator, however, provides an M-bit output to the M-bit digital-to-analog converter 15 (M-bit DAC) via line 39. The M-bit DAC 15 converts the M-bit digital input into an analog output and provides it on DACOUT line 23. The difference amplifier 11 compares (subtracts) the M-bit DAC output on line 23 with the analog input on line 21 to obtain an analog difference signal or the residue between these two inputs. The difference amplifier 11 amplifies this residue and applies or routes it to the input of the K-bit ADC 13 on line 24 to obtain a K-bit digital (or a digital encoded signal) at the output of the K-bit ADC. This routing is performed by the control signal HI/LO 55, when this signal attains the LO-state 55b. The signal HI/LO 55 also directs the output of the K-bit ADC, which corresponds to the amplified residue, to the least significant K-bit positions of the M-bit accumulator. It will be noted that prior to loading either the most significant bit (MSB) or least significant bit (LSB) locations, all of these locations have been initialized to a digital or a binary state of "O." This will be the first time when all of the M-bits of the M-bit accumulator 14 are utilized. The new M-bit output (the composite digital signal) of this M-bit accumulator is now again applied to the M-bit DAC 15 via line 39. The process or sequence of the amplification of the residue (difference), its conversion to a K-bit digital encoding and its accumulation in the M-bit accumulator 14 is repeated a predetermined number of times to obtain a stable M-bit representation of the input signal. It will be noted that as long as the HI/LO signal 55 stays in the LO state 55b, only the amplified residue between the output of M-bit DAC 15 and the external analog signal is applied to the K-bit ADC 13.

The amplification of the residue (difference) between the analog input already on line 21 and the first analog output from the M-bit DAC on line 23 is done so that the bit weight of the K-bit conversion of this residue is equal to that of an equivalent M-bit conversion. This bit weight equivalence would require a gain of $2^{}(M-K)$. Part of this required gain is provided by the difference amplifier and the remaining gain factor comes from the different values of full scale range (FSR) used by the HRADC and the K-bit ADC. As an example, for a system with $M=16$ and $K=8$, the required gain will be equal to $2^{}(16-8)=256$.

FIG. 3 illustrates one embodiment of a difference amplifier. In the above example, the difference amplifier will provide a gain of 64, which is determined by the ratio of the resistors R5 to R4 or R8. In this example, the HRDAC will use a FSR of 16.384 volts while the 8-bit ADC FSR will be 4.096 volts, resulting in the additional required gain factor of 4.0.

The sequence or the process described above generates K-bits for each difference between the input signal 21 and the analog signal corresponding to the result in the M-bit accumulator 14 presented to the K-bit ADC 13. These K-bit results are added algebraically to the value in the M-bit register by successive activation of the signals ADC* 53 and SRUA56. This activation occurs when the signals change their state, i.e. from 53a to 53b and from 56b to 56a respectively. Following the initialization step, several updates of the M-bit accumulator 14 are performed to assure that the value in the M-bit accumulator 14 is a stable or proper M-bit sample of the input signal. It will be noted that due to the feedback arrangement illustrated in FIG. 1, the M-bit accumulator 14 is driven toward a value which reduces the residue to within one least significant bit. The residue, of course, will be near zero only when the M-bit sample in the valve represented by the M-bit accumulator properly encodes the value of the input signal on line 21.

As illustrated in FIG. 1 and described earlier, the M-bit DAC 15 output is subtracted from the input signal and only the residue from this subtraction is converted. The use of this fact enables the use of a low resolution K-bit ADC 13 to update a higher resolution M-bit accumulator 14. The K-bit ADC 13 linearly converts the residue and properly updates the M-bit accumulator 14, thereby keeping it in bounds, as long as the input signal changes by less than $FS/2^{}(M-K)$ during a single clock cycle. As an example, if $M=16$ and $K=8$, the input can change by no more than $FS/2^{}(16-8) = FS/256$ during a single clock cycle. If the input changes by more than this amount, a track and hold circuit or some alternative means may be used to condition the external input. Alternatively, the resolution of the K-bit ADC 13 may be increased to accomplish the same result.

After the M-bit accumulator 14 has a proper sample in it, i.e., an M-bit digital sample corresponding to the sampled input, the N-bit accumulator 20 is activated. The activation loads the M-bit accumulator 14 contents in the N-bit accumulator 20. This process is repeated $-2^{}(N-M)$ times so that the final value in the N-bit accumulator is an N-bit resolution sample of the input signal. This N-bit resolution is obtained because the algebraic addition of an M-bit result is repeated $2^{}(N-M)$ times. Mathematically this relationship can be expressed as $2^{**}(N-M) * 2^{}M = 2^{}N$ It will be noted that the M-bit accumulator is updated, as described earlier, during the entire conversion time. In this manner the value that ends up in the N-bit accumulator represents an average value of the input during the conversion time.

When the HRADC of FIG. 1 is operated as described above, the result in the N-bit accumulator will not be a true N-bit resolution result. This is because, as described above, during the conversion of a constant input, the M-bit accumulator 14 remains at a constant value which is closest to the actual input. In such case, the $2^{}(N-M)$ successive algebraic additions described above simply shift the M-bits into the most significant M-bit locations of the N-bit accumulator 14, thereby leaving the $N-M$ least significant bits in the binary state of zero. As an example, consider $N=23$ and $M=16$. After $2^{}N-M = 2^{}23-16 = 2^{}7 = 128$ successive additions of a constant 16-bit result, the 23-bit accumulator will have the form:

$$\underbrace{xxxxxxxxxxxxxxxx}_{M=16} \underbrace{0000000}_{N-M=7}$$
$$N=23$$

where the x's indicate the 16-bit conversion of a constant input, which is simply shifted by the repeated (128 times) additions into the 23-bit accumulator. It will be noted that for the sake of simplicity, an N-bit resolution and an N-bit accumulator have been described above. In practice, however, the accumulator may comprise more than N-bits.

The use of a dither 12 as illustrated in FIG. 1 resolves the above-described problem and enables the N-bit accumulator and thus the HRADC 9 to provide a true N-bit resolution digital output. The timing and control circuit 16 controls the operation of the dither.

The benefit of a dither signal is two-fold: (1) it increases the resolution of the final N-bit result, and (2) it reduces the effect of any non linearity in the M-bit DAC.

In this invention, a dither signal is a small analog signal that is added to the external (input) analog signal such that the average value of the dither signal over the conversion time is equal to zero. The dither signal may be designed to sweep over a range of voltages equal to an integer multiple of the quantum of the K-bit ADC. A dither signal is generated by a dither means 12 and input to the difference amplifier 11 on line 22. Now consider the effect of a dither signal added to the amplified residue signal. If the average value of the dither signal over the conversion time is zero, it will not affect the final result. However, if the dither signal varies linearly during the conversion time of $2^{}(N-M)$ clock cycles over the amplitude window of one least significant bit (LSB) quantum of the M-bit feedback path, then the resolution can be increased. Because the dither signal varies within values below and values above the residue, the M-bit feedback path will provide a result that is too low during a part of the conversion time and a result that is too high during the remaining part of the conversion time. The N-bit accumulator averages the M-bit results (the output of the M-bit accumulator updated by the use of the dither) over each conversion time. As an example, to obtain a 23 bit resolution the N-bit accumulator will average the 16-bit accumulator results $2^{}(23-16) = 128$ times over the conversion time. The dither may be made to sweep an equivalent of one least significant bit (LSB) i.e. $\pm\frac{1}{2}$ LSB. Assume that the analog input is at a value that is 25% of an M-bit quantum above an allowed M-bit sample value (say Y1) and therefore 75% of a M-bit quantum below the next higher allowed M-bit sample value (say Y2=Y1 +1). The dither will then cause the M-bit ADC path to provide a value of Y1 for 75% of the conversion time and a value of Y2 for 25% of the conversion time. The averaged result from the N-bit accumulator would be a N-bit representation of the current result, thereby providing an output at the N-bit accumulator which is a true N-bit resolution representation of the analog input signal. The result of the N-bit accumulator can be represented as: Y1 * 0.75+Y2 * 0.25 =Y1 * 0.75 +(Y1 +1) * 0.25 =Y1 +0.25.

The use of a dither to improve the resolution will become more evident from the following discussion.

For the purpose of this discussion, assume that the HRADC is designed to linearly quantize a +/−8.192V range into 23 bits and that the HRADC uses an 8 bit flash ADC and a 16 bit feedback path. These parameters result in an 8 bit quantum of 64 mV (16.384 / 28), a 16 bit quantum of 0.25 mV (16.384 / 216), and a 23 bit quantum of 1.953125 uV (16.384 / 2**23).

For an input of 3.25018V the DACOUT signal will be initialized to a value of 3.25025V, the closest value available in the 16 bit feedback path. This value of DACOUT corresponds to a count of 13,001 into the 16 bit DAC. The amplified residue from the input amplifier will therefore be 256 * (−70.0 uV) = −17.92 mV. This is below the resolution of the 8 bit ADC which has a LSB of 64 mV. The 8 bit ADC will therefore provide a zero count for all subsequent conversions and the number 13,001 will simply be added 128 times into the 24 bit accumulator, resulting in a final count of 1,664,128. This count, on a 23 bit basis, also corresponds exactly to 3.25025 V so that no additional resolution has been obtained from the 128 additions.

Now, assume that a small dither signal is added to the amplified residue which goes to the 8 bit ADC such that the signal linearly sweeps across one quantum of the 8 bit ADC during the time that the 128 conversions are being performed. For simplicity, assume that the signal starts at −0.5 quantum at the first conversion and increases linearly so that it has reaches −0.5 quantum at the 128'th conversion. A short table will help the discussion.

| conv. # | dither | residue | 8 bit # | 16 bit # | DACOUT |
|---|---|---|---|---|---|
| 0 | 00.00 | −17.92 mV | 0 | 13,001 | 3.25025 |
| 1 | −32.0 mV | −49.92 mV | −1 | 13,000 | 3.25000 |
| 2 | −31.5 mV | +14.58 mV | 0 | 13,000 | 3.25000 |
| 3 | −31.0 mV | +15.08 mV | 0 | 13,000 | 3.25000 |
| . | | | | | |
| . | | | | | |
| 35 | −15.0 mV | +31.08 mV | 0 | 13,000 | 3.25000 |
| 36 | −14.5 mV | +31.58 mV | 0 | 13,000 | 3.25000 |
| 37 | −14.0 mV | +32.08 mV | 1 | 13,001 | 3.25025 |
| 38 | −13.5 mV | −32.42 mV | 0 | 13,001 | 3.25025 |
| . | | | | | |
| . | | | | | |
| 65 | 0.0 mV | −17.92 mV | 0 | 13,001 | 3.25025 |
| . | | | | | |

-continued

| conv. # | dither | residue | 8 bit # | 16 bit # | DACOUT |
|---|---|---|---|---|---|
| . | | | | | |
| 128 | +31.5 mV | +13.58 mV | 0 | 13,001 | 3.25025 |

The final result in the second accumulator is therefore:

(36 * 13,000) +(92 * 13,001) =1,664,092 which is the 23 bit representation of 3.2501797, the closest available 23 bit representation of 3.25018 V.

It will be seen that the above result holds if the dither sweeps over an integer multiple of the K-bit quantum during the conversion time. This is done by increasing the amplitude of the dither signal. Since various components in the system contribute to inaccuracies, it may be advantageous to make the dither signal sweep over several least significant bits. Additionally, the linearity of the system i.e. the high resolution analog-to-digital converter circuit can be improved by increasing the amplitude of the dither signal. This is because the HRDAC linearity critically depends upon the M-bit feedback path. The dither signal amplitude is such that the M-bit feedback path operates over several sample values during the conversion time. The linearity is improved since the resulting linearity is the average of the operating points of the M-bit feedback path during the conversion time.

The dither described above would be considered as a deterministic type. The benefits derived from a deterministic dither can also be obtained from a stochastic dither. Any wave form which approximately covers either one K-bit quantum or an integer multiple of the K-bit quantum during the conversion time will increase the resolution of the HRADC.

The use of a dither signal over the use of an integrator as discussed herein for charge balance ADC provides an additional advantage. In a high resolution application, an integrator, although technically feasible, is very difficult to implement. This is because the output glitches from the feedback DAC limit the obtainable linearity, since the energy in the DAC output glitches is integrated along with the difference signal. Since there is no analog integrator in the feedback path in the disclosed system, the DAC glitches do not limit the obtainable linearity.

After 2*(N−M) M-bit samples have been added algebraically to the N-bit accumulator, the final result is present at the N-bit accumulator output. This final result is latched into an output register by the control signal DTLACH*59, as illustrated in FIG. 2.

The entire sequence described above in then repeated to convert the next sample of the analog input.

The foregoing description has been directed to particular embodiments of the invention. It will be apparent, however, to those skilled in the art that many modifications and changes in the apparatus and method set forth will be possible without departing from the scope and spirit of the invention. It is intended that the following claims be interpreted to embrace all such modifications and changes.

What is claimed is:

1. An apparatus for converting an analog input signal into a digital signal, comprising:
   (a) a K-bit analog-to-digital converter (ADC) for converting analog signals into a K-bit digital signal, where K is an integer;

(b) an M-bit accumulator, operatively coupled to said K-bit ADC, where M is an integer, for accumulating said K-bit digital signals in at least one set of bit locations, each set having K-bits, said accumulator also providing an M-bit digital output;

(c) an M-bit digital-to-analog converter (DAC) operatively coupled to said M-bit accumulator, said M-bit DAC adapted to receive and convert said M-bit digital output into an analog feedback signal;

(d) circuit means for passing said input signal through said K-bit ADC for accumulation of the resulting K-bit digital signal in a set of bit locations in said M-bit accumulator;

(e) a difference amplifier operatively coupled to said K-bit ADC for amplifying the difference between said input signal and said feedback signal and passing the amplified difference through said K-bit ADC for accumulation of the resulting K-bit digital signal in a set of bit locations in said M-bit accumulator; and (f) an N-bit accumulator, where N is an integer greater than M, operatively coupled to said M-bit accumulator, said N-bit accumulator adapted to receive and successively add said M-bit digital output to provide a digital signal output having higher resolution than the resolution of said M-bit digital output.

2. The apparatus as defined in claim 1 wherein said K equals 8, M equals 16 and N equals 24.

3. An apparatus for converting an analog input signal into a digital signal in a conversion time, comprising:

(a) a K-bit analog-to-digital converter (ADC) for converting analog signals into a K-bit digital signal, where K is an integer;

(b) an M-bit accumulator, operatively coupled to said K-bit ADC, where M is an integer, for accumulating said K-bit digital signals in at least one set of bit locations, each set having K-bits, said accumulator also providing an M-bit digital output;

(c) an M-bit digital-to-analog converter (DAC) operatively coupled to said M-bit accumulator, said M-bit DAC adapted to receive and convert said M-bit digital output into an analog feedback signal;

(d) an input circuit comprising a difference amplifier to amplify an analog signal and a dither circuit to generate a dither signal, said input circuit adapted to:

(i) pass said input signal through said K-bit ADC for accumulation of the resulting K-bit digital signal in a set of bit locations in said M-bit accumulator;

(ii) pass an amplified difference between said input signal and said feedback signal through said K-bit ADC for accumulation of the resulting K-bit signal in a set of bit locations in said M-bit accumulator; and (iii) add said dither signal to said amplified difference and to pass the resulting signal through said K-bit ADC for accumulation of the resulting K-bit signal in a set of bit locations in said M-bit accumulator; and (e) an N-bit accumulator, operatively coupled to said M-bit accumulator, where N is an integer greater than M, said N-bit accumulator adapted to receive and successively add said M-bit digital output to provide a digital signal output having higher resolution than the resolution of said M-bit digital output.

4. The apparatus as defined in claim 3 wherein said K equals 8, M equals 16 and N equals 24.

5. The apparatus as defined in claim 3 wherein said dither signal is an analog signal whose average value over the conversion time in equal to zero.

6. The apparatus as defined in claim 3 wherein said N-bit accumulator successively adds said M-bit digital output $2^{**}(N-M)$ times to obtain a digital signal at its output having a N-bit resolution.

7. An analog-to-digital converter comprising:

(a) timing and control means for generating timing and control signals;

(b) an input circuit, operatively connected to said timing and control means, for receiving analog signals;

(c) a multi-bit analog-to-digital converter, operatively connected to said input circuit for generating multi-bit digital signals corresponding to the output of said input circuit;

(d) a first multi-bit accumulator, operatively connected to said multi-bit analog-to-digital converter, said multi-bit accumulator having the bit capacity equal to at least the bit capacity of said multi-bit analog-to-digital converter, for receiving said multi-bit digital signals;

(e) a feedback means operatively connected to said first multi-bit accumulator and said input circuit for providing an analog signal to said input circuit which corresponds to the output of said first multi-bit accumulator; and (f) a second multi-bit accumulator, operatively connected to said first multi-bit accumulator and said timing means, which has a bit capacity greater than the bit capacity of said first multi-bit accumulator, to receive the output from said first multi-bit accumulator and to provide a high resolution multi-bit digital output.

8. A high resolution analog-to-digital converter comprising:

(a) timing and control means for generating timing and control signals;

(b) an input amplifier means comprising a difference amplifier and a dither circuit, said input amplifier operatively coupled to said timing and control means for receiving and amplifying analog signals;

(c) a multi-bit analog-to-digital converter, operatively connected to said input amplifier means for generating multi-bit digital signals corresponding to the analog output of said input amplifier means;

(d) a multi-bit accumulator, operatively connected to said multi-bit analog-to-digital converter and said timing and control means, for receiving said digital signals in accordance with a predetermined sequence;

(e) a feedback means operatively connected to said input circuit and said first multi-bit accumulator means for providing an analog signal to said input circuit which corresponds to the output of said first multi-bit accumulator; and (f) a second multi-bit accumulator, operatively connected to said first multi-bit accumulator and said timing and control means, for receiving and successively adding the multi-bit output of said first multi-bit accumulator means thereby providing a digital output which has higher resolution than the resolution of the output of the first multi-bit accumulator.

9. A high resolution analog-to-digital converter for converting an analog input signal to a digital output comprising:
  (a) timing and control means for generating timing and control signals;
  (b) a dither, operatively connected to said timing and control means, for generating a dither signal;
  (c) an input amplifier, operatively connected to said dither and timing and control means, for receiving said dither signal and said analog input signal;
  (d) a K-bit analog to digital converter, operatively connected to said input amplifier and said timing and control means, for converting the output of said input amplifier to a K-bit digital output;
  (e) an M-bit accumulator, operatively connected to said K-bit analog-to-digital converter, where M is at least equal to the value of K, for receiving said K-bit digital output in accordance with a sequence so as to provide a stable M-bit output which corresponds to said analog input signal;
  (f) a feedback means, operatively coupled to said M-bit accumulator, for providing an analog feedback signal to said input amplifier which corresponds to the M-bit output of said M-bit accumulator; and
  (g) an N-bit accumulator, operatively connected to said M-bit accumulator, where N is greater than M, said N-bit accumulator adapted to receive and successively add said M-bit output a predetermined number of times to provide an N-bit output having a higher resolution than the resolution of said M-bit output.

10. A method of converting an analog input signal into a digital signal, the method comprising the steps of:
  (a) converting said analog input signal into a first digital signal having a first plurality of bits;
  (b) accumulating said first plurality of bits in a first set of bit locations in an accumulator, said accumulator also providing a digital signal output having a second plurality of bits which is at least equal to the first plurality of bits;
  (c) converting said second plurality of bits into an analog feedback signal;
  (d) converting the amplified difference between said analog input signal and said feedback signal into a digital signal having a third plurality of bits, where said first and third pluralities are equal; and
  (e) accumulating said third plurality of bits in a second set of bit locations in said accumulator to obtain a digital signal output of said accumulator having a second plurality of bits which correspond to said input signal.

11. A method of converting an analog input signal into a digital signal having a predetermined resolution, said method comprising the steps of:
  (a) converting said analog input signal into a stable M-bit digital signal, where M is an integer;
  (b) placing the stable M-bit digital signal in a first accumulator; said first accumulator also providing an M-bit digital output;
  (c) adding the M-bit digital output into an N-bit accumulator, where N is an integer greater than M; said N-bit accumulator also providing an N-bit digital output;
  (d) updating the M-bit digital signal the use of a dither signal to obtain an updated M-bit digital output;
  (e) adding the updated M-bit digital output into said N-bit accumulator; and;
  (f) repeating steps (d) and (e) a predetermined number of times to obtain an M-bit digital output having the predetermined resolution.

12. The method of claim 11 wherein M equals 16 and N equals 24.

13. A method of converting an analog input signal into a digital signal, the method comprising the steps of:
  (a) converting the analog input signal into a digital signal having K-bits, where K is an integer;
  (b) placing the K bits of the digital signal into the K most significant bit locations of an accumulator of "2K" bit capacity as the K most significant bits in a composite digital signal having "2K" bits, and wherein the K next most significant bits have values set to digital zero;
  (c) converting the composite digital signal into an analog feedback signal;
  (d) subtracting the analog feedback signal from the analog input signal to form an analog difference signal;
  (e) amplifying the analog difference signal by $2**K$;
  (f) converting the amplified analog difference signal into a digital difference signal having K-bits;
  (g) placing the digital difference signal in the accumulator to update the K next most significant bits in the composite digital signal; and
  (h) repeating steps (c) and (g) a predetermined number of times to obtain a stable updated composite digital signal.

14. A method of converting an analog input signal into a digital signal, the method comprising the steps of:
  (a) converting said input signal into a first digital signal having a first plurality of bits;
  (b) accumulating said first plurality of bits in a first set of bit locations in a first accumulator, said first accumulator also providing a digital output having a second plurality of bits which is at least equal to the first plurality of bits;
  (c) converting the digital output of said first accumulator into an analog feedback signal;
  (d) amplifying and converting the difference between said input signal and said feedback signal into a difference digital signal having a first plurality of bits and accumulating the difference digital signal in a second set of bit locations in said first accumulator to obtain at the output of said first accumulator a second digital signal having a resolution equal to said second plurality of bits;
  (e) repeating steps (c) and (d) a predetermined number of times to obtain a second digital signal;
  (f) adding the second digital signal into a second accumulator having the bit capacity greater than the second plurality of bits, said second accumulator also providing a digital signal output having resolution greater than said second plurality;
  (g) adding a dither signal into the amplified difference between said feedback signal and said analog input signal to update the bits in said second set of bit locations in said first accumulator;
  (h) adding the output of said first accumulator into said second accumulator; and
  (i) repeating steps (g) and (h) a predetermined number of times to obtain a digital output at said second accumulator which is a digital signal and which has higher resolution than said second plurality.

15. A method of converting an analog input signal into a digital signal having a predetermined resolution, the method comprising the steps of:

(a) converting the analog input signal into a digital signal having K-bits, where K is an integer;

(b) placing the K-bits of the digital signal into the K most significant bit locations of an M-bit accumulator, and wherein the M−K next most significant bit locations have values set to digital zero, where M is an integer and M is at least, said M-bit accumulator also providing an M-bit digital signal output;

(c) converting the M-bit digital signal into an analog feedback signal;

(d) amplifying the difference between the analog input signal and the analog feedback signal;

(e) converting the amplified difference into a digital difference signal having K-bits;

(f) placing the digital difference signal in the K next most significant bit locations of said M-bit accumulator;

(g) repeating steps (c) through (f) a predetermined number of time to obtain a stable M-bit digital signal;

(h) adding the stabilized M-bit digital signal in an N-bit accumulator, where N is an integer greater than M, said N-bit accumulator also providing an N-bit digital output;

(i) adding a dither signal into said amplified difference to obtain a K-bit digital difference signal;

(j) placing the digital difference signal into said next most significant bit locations to update said M-bit digital signal;

(k) adding the updated digital signal into said N-bit accumulator; and (l) repeating steps (i) through (k) a predetermined number of times to obtain an N-bit digital signal having the predetermined resolution.

16. The method of claim 15 wherein said amplification of the difference between the analog input signal and the analog feedback signal is $2**K$.

17. The method of claim 16 wherein K equals 8, M equals 16 and N equals 24.

18. The method of claim 15 wherein repeating steps (i) through (K) as defined in step (1) is performed $2**(N-M)$ times to obtain a digital signal having a resolution of N and which corresponds to said analog input signal.

* * * * *